United States Patent [19]

Obermeyer, Jr. et al.

[11] Patent Number: 4,961,013
[45] Date of Patent: Oct. 2, 1990

[54] APPARATUS FOR GENERATION OF SCAN CONTROL SIGNALS FOR INITIALIZATION AND DIAGNOSIS OF CIRCUITRY IN A COMPUTER

[75] Inventors: John R. Obermeyer, Jr., Campbell; John F. Shelton, Aptos; Donald A. Williamson, Cupertino, all of Calif.

[73] Assignee: Hewlett-Packard Company, Palo Alto, Calif.

[21] Appl. No.: 423,306

[22] Filed: Oct. 18, 1989

[51] Int. Cl.$^5$ .................. H03K 19/02; H03K 17/16
[52] U.S. Cl. ........................ 307/480; 307/443; 307/269; 307/601; 371/22.3
[58] Field of Search ........ 307/443, 269, 480, 600-603, 307/ 272.1; 371/22.3

[56] References Cited

PUBLICATIONS

IBM Tech. Disc. Bul. "Simplified LSSD Clock Generator" Bersac et al., vol. 27, No. 4A, 9/84.
IBM Tech. Dis. Bul. "Functional Use of LSSD a Clock" vol. 31, No. 12, May 1989.

Primary Examiner—Stanley D. Miller
Assistant Examiner—Margaret Rose Wambach
Attorney, Agent, or Firm—Roland I. Griffin; Alan H. Haggard

[57] ABSTRACT

A scan testable circuit in a computer system is controlled by using a single scan clock and a fixed delay circuit to realize the required scan clocks and a required scan mode enable signal. The multiple signals are generated from a subset of signals supplied to the scan control signal generation circuit. System data and scan data are routed through a multiplexer to test or initialize lines and circuitry. A scan control signal generation circuit according to the invention has the advantage of eliminating as excess a scan mode enable signal originating elsewhere in the computer system, thereby eliminating unneeded signal traces while minimizing the number of pins required for this function. In a first embodiment, a scan mode enable signal is generated from one of two scan clocks. In a second embodiment, both scan clocks and the scan mode enable signal are generated from a single source clock.

5 Claims, 2 Drawing Sheets

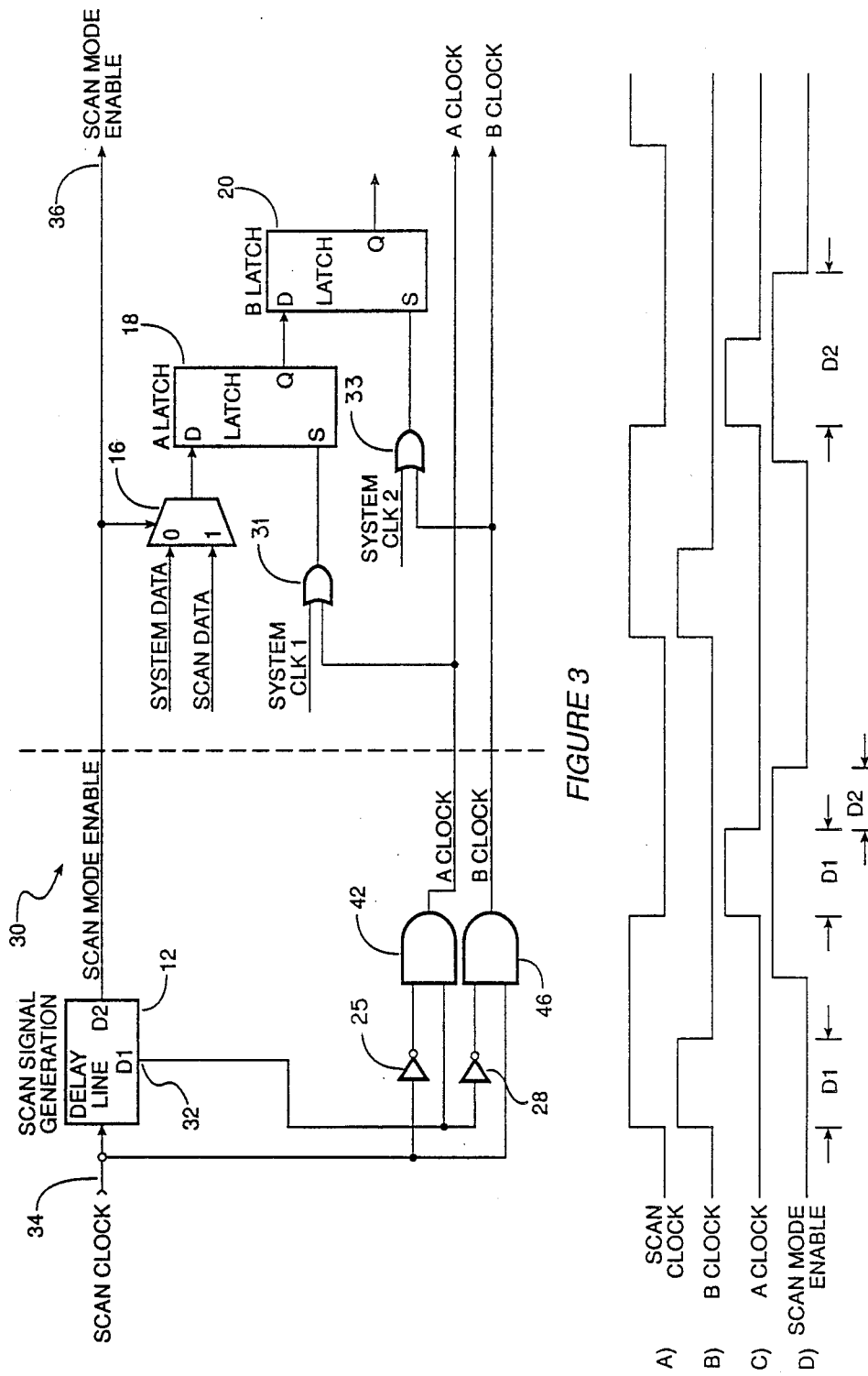

APPARATUS FOR GENERATION OF SCAN CONTROL SIGNALS FOR INITIALIZATION AND DIAGNOSIS OF CIRCUITRY IN A COMPUTER

BACKGROUND OF THE INVENTION

This invention relates to computer structures which employ scan techniques for internal diagnostics and system initialization. More particularly, the invention can be applied to electronic circuits in self-testing computers which employ a double-latch technique for implementing level sensitive scan design (LSSD). Other applications of the invention are also contemplated, such as single-latch or edge-triggered logic designs.

The level sensitive scan design method of IBM Corporation is one of the better known methods for internal scan path testing of LSI logic circuits employed in several classes of computer systems. Specifically, level sensitive scan design is a logic design scheme relying on achievement of a preselected voltage level for logic values, as opposed to edges of a signal in a digital data stream. Further, the logic circuit in an LSI circuit component is divided into combinatorial circuit portions and sequential circuit portions. The sequential circuits can be connected in series through switching circuits, which when connected comprise a shift register.

The testing of an LSSD circuit or other scan testable circuits is performed by switching between a "shift mode" and a "normal mode." In the shift mode, a scan signal is input to the shift register whereby data is applied in a predetermined pattern of ones and zeroes. The sequential circuits are then disconnected by the switches and returned to the logic circuit. A predetermined logic operation is then performed, after which the sequential circuits are reconnected to form the shift register, and the data of the shift register is read out and checked.

Scan testable circuits have certain disadvantages. For example, extra signal lines are required to implement the test function. A circuit using a double-latch technique to implement level sensitive scan design (LSSD) requires two scan clocks and a scan mode enable signal in addition to the conventional system clocks. In the past, separate lines had been required for conveying these signals across the backplane bus of a computer system among the various circuit cards. As a consequence, there has been an allocation of a certain number of pins for circuits and signal traces for carrying signals. It is desirable to minimize the number of pins and signal traces required for an LSSD circuit employing a double-latch technique.

SUMMARY OF THE INVENTION

According to the invention, a scan testable circuit in a computer system is controlled by using a single scan clock and a fixed delay circuit to realize the required scan clocks and a required scan mode enable signal. The multiple signals are generated from a subset of signals supplied to the scan control signal generation circuit. System data and scan data are routed through a multiplexer to test or initialize lines and circuitry. A scan control signal generation circuit according to the invention has the advantage of eliminating as excess a scan mode enable signal originating elsewhere in the computer system, thereby eliminating unneeded signal traces while minimizing the number of pins required for this function.

In a first embodiment, a scan mode enable signal is generated from one of two scan clocks. In a second embodiment, both scan clocks and the scan mode enable signal are generated from a single source clock.

BRIEF DESCRIPTION OF THE DRAWINGS

FIG. 3 is a schematic diagram of a second embodiment of a double latch based circuit according to the invention.

FIGS. 4(a–d) is a timing diagram illustrating a relationship of a single source scan clock and A and B clocks and the scan mode enable signal.

DESCRIPTION OF SPECIFIC EMBODIMENTS

Figure 1:
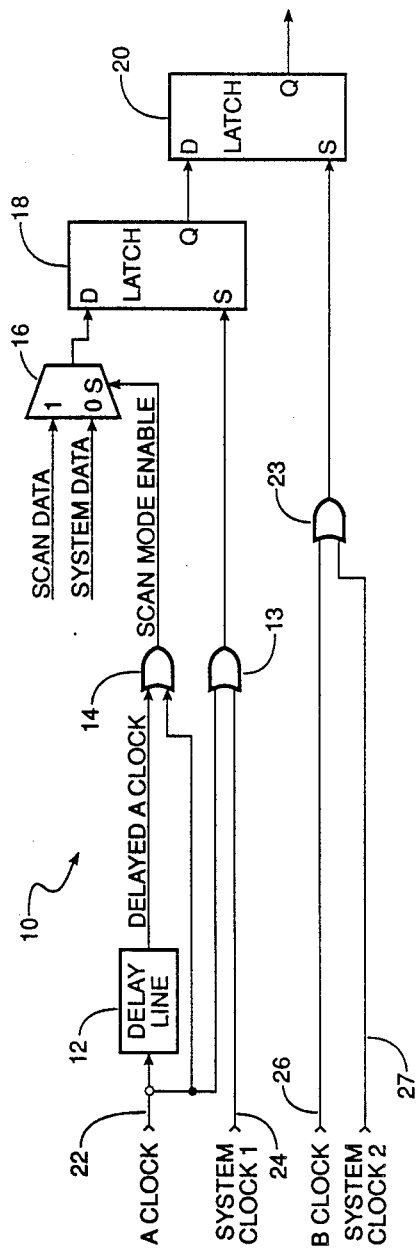
FIG. 1 is a block diagram of a first embodiment of a double-latch based circuit for generating scan control signals.
Figure 2:
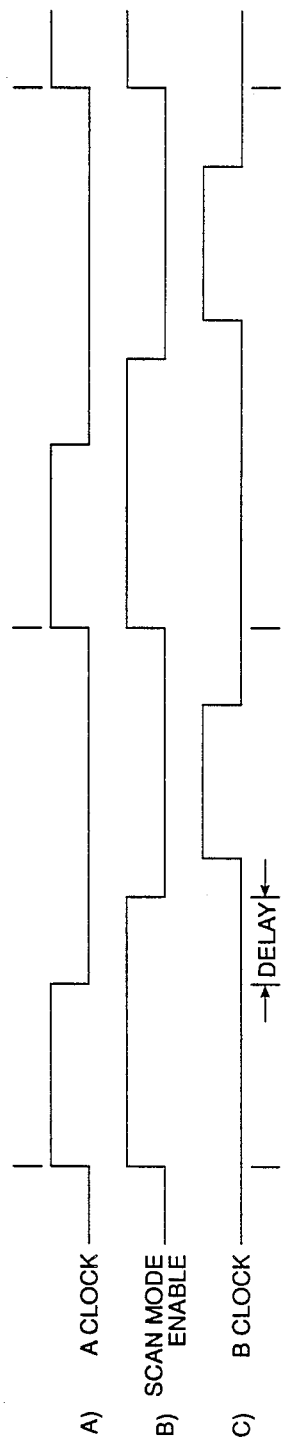
FIGS. 2(a–c) is a timing diagram illustrating a relationship of clocks A and B and a scan mode enable signal.

Referring to FIG. 1, a circuit 10 according to the invention shows a double-latch implementation. As will be explained hereinafter, the invention is also applicable to other applications. The circuit 10 as shown comprises a delay line 12, a first OR gate 14, a multiplexer 16, a first latch 18, a second latch 20 and a second OR gate 13. The delay line 12 is coupled to an A clock input 22, the A clock 22 being also coupled to a second input of the first OR gate 14 and a first input of the second OR gate 13. The output of the delay line 12 is coupled to a first input of the first OR gate 14. The output of the first OR gate 14 is the scan mode enable signal which is formed by the signal produced by the A clock input 22 and the delayed signal produced by the delay line 12 (FIG. 2, lines A and B). The scan mode enable signal sets the multiplexer 16 to receive scan data when active and otherwise to receive system data when inactive. The output of the multiplexer 16 is coupled to the data input of first latch 18. The first latch 18 is operative to capture data during the period that the A clock signal 22 is enabled or in its one state. The A clock signal is received at the S or strobe input of the first latch 18 through a second OR gate 13. The first system clock through system clock 1 input 24 is also supplied through the second OR gate 13 so that system data can be clocked into the first latch 18.

In some specific embodiments, it is unnecessary to provide further clocks or the like for diagnostics or initialization. In fact, the first latch 18 is not a necessary element of the invention. Rather, it is a beneficiary of the signal generated in accordance with the invention.

In a specific embodiment of a double-latch-type circuit, additional circuitry is provided. The output of the first latch 18 is connected to the data input of the second latch 20, the second latch 20 being operative under control of a B clock supplied to the S or strobe input of the second latch 20 via the third OR gate 23 from the B clock signal line 26. The second system clock 2 through system clock 2 input 27 is also supplied through the third OR gate 23.

The scan mode enable signal, which is normally required in a double-latch LSSD design or other scan testable circuit to select scan mode data rather than system mode data for the latch is generated in accordance with this invention by use of the delay line 12 on the A clock routed through first OR gate 14. The delay value used is determined by the minimum hold time and the maximum signal propagation skews of the scan mode enable signal and the A clock. A delay longer than the active period of the A clock is not contemplated, thus limiting the scan mode enable signal to no more than twice the length of the active period of the A clock. On the other hand, a minimum delay value must be greater than the hold period of the first latch 18 plus the propagation time of the A clock minus the minimum scan mode enable signal propagation time to the worst-case latch 18/multiplexer 16 pair. As will be noted from FIG. 1, line C of FIG. 2, the B clock used for the second clock latch, is independent of the scan mode enable signal. The output of the second latch 20 can be coupled to a further chain of latches in accordance with the LSSD scheme or other cascade scheme.

In operation, diagnostics are performed by activating the scan mode enable signal to route scan data into a cascade of latches which, with each clock cycle, loads the latch pair with a known value supplied through the scan data input. Thereafter, the system clock signals are employed (while the scan mode enable signal is off) to load the pair of latches with system data. Thereafter, the scan mode enable signal is turned back on and the data can be examined to determine if all of the circuitry between pairs of latches worked properly, having a knowledge of what the scan data is at that moment. (The circuitry for examining the diagnostic data is conventional and is therefore not shown here.)

Referring now to FIG. 3, there is shown a second embodiment of a scan clock generation circuit 30 in accordance with the invention. According to this scan clock generation circuit 30, both variable pulse width and separation can be implemented. The circuit 30 comprises a delay line 12, a multiplexer 16, a first latch 18, a second latch 20, a first AND gate 42 with a first inverter 25 at its input, a second AND gate 46 with a second inverter 28 at its input, a first OR gate 31 and a second OR gate 33.

The circuit 30 has a single scan input clock, in this case referred to as the scan clock input 34. The scan mode enable signal output 36 is the direct output of the delay line 12 after a second delay D2, as indicated in FIG. 4, line D as compared to FIG. 4, line A.

The first AND gate 42 is coupled to receive a delayed input from the delay line 12 after a first delay D1, as indicated by output line 32. The first AND gate 42 receives an inverted input-signal from a scan clock 34 through the first inverter 25.

The second AND gate 46 receives a first input from the scan clock 34 and a second, inverted, input from the delayed line 32 through the second inverter 28.

The multiplexer 16 receives either system data input or scan data input, scan data input being activated when the scan mode enable signal on line 36 is active. The output of the multiplexer 16 is coupled to the data input of the first latch 18. The output of the first latch 18 is coupled to the data input of the second latch 20. The signal, A clock, is coupled through the first OR gate 31 to the S or strobe input of the first latch 18. The input of the first OR gate 31 is provided for a first system clock. The output of the second AND gate 46, which is the B clock (the output of the first AND gate 42 being the A clock) is coupled to the strobe input of the second latch 20 through the second OR gate 33. A second system clock is provided through a second input of the second OR gate 33.

The two-tap delay line 12, in connection with the first and second AND gates 42 and 46 and the inverters 25 and 28, provide a convenient way to generate the scan mode enable signal, the A clock and the B clock from a single scan clock signal on line 34.

The circuit 30 of FIG. 3 operates as follows: The B clock and the A clock scan clock pulses are initiated at the rising and falling edges of the scan clock signal at the scan clock input 34, respectively (lines B and C of FIG. 4). This is because the AND gate 46 of the B clock is activated at the leading edge of the scan clock, and the first AND gate of the A clock is activated only after the scan clock 34 has been deactivated. The timing of the two scan clocks A and B is determined by the pulse length of the scan clock input signal. The B clock is generated using the scan clock 34 signal and the delayed scan clock signal 32 leading edge as applied through the first delay D1.

The A clock is generated in a similar manner by the falling edge of the scan clock input signal using an inverted version of the scan clock and the delayed version of the scan clock signal. The duration is equal to the delay value used to delay the scan clock signal D1.

The length of the scan clock pulses is determined by the value at the first delay tap. The length can thus be modified by choosing a different delay value. The pulse width for the two clocks, A and B, may be different if a different delay tap is used for the generation of each. In the embodiment herein shown, the same tap is employed. The minimum delay value used is determined by the minimum pulse width specifications of the latches clocked by the scan clocks.

The scan mode enable signal is used in accordance with the invention to select scan data over system data as the control signal for the multiplexer 16. The delay value, which is provided at the second D2 tap of the delay line 12, must be larger than the pulse width for the A clock, which is determined by the first delay D1 tap. The required hold time for the scan mode enable signal, as compared to the A clock signal, is determined by the characteristics of the circuitry under test. A hold time for the scan mode enable signal may be controlled by the difference in the delay values for the D2 tap and the D1 tap in order to allow adjustment to insure that the hold time required is met. The scan clock input signal 34 must have a pulse which has a duration greater than the delay time D1.

The invention has now been described with reference to specific embodiments. Other embodiments will be apparent to those of ordinary skill in the art in view of the foregoing disclosure. It is therefore not intended that this invention be limited, except as indicated by the appended claims.

What is claimed is:
1. A circuit for controlling scan data with reduced numbers of scan control lines, said circuit comprising:
   a delay line;
   a two-input multiplexer for system data and scan data;
   a first clocked latch; and
   a first OR gate;
   said delay line being coupled to receive a first clock input signal to produce a delayed first clock output signal, said first OR gate being coupled to receive said delayed first clock output signal and said first clock input signal to yield a scan mode enable signal;
   said multiplexer being coupled to receive as a control input said scan mode enable signal from said first OR gate; and said first clock latch having a data input coupled to a data output of said multiplexer and a strobe input coupled to receive a clock signal.

2. A circuit for controlling scan data in a level sensitive scan design, said circuit comprising:
   a delay line;
   a two-input multiplexer for system data and scan data;
   a first clocked latch;
   a second clocked latch; and
   a first OR gate;
   said delay line being coupled to receive a first clock input signal to produce a delayed first clock output signal, said first OR gate being coupled to receive said delayed first clock output and said first clock input signal to yield a scan mode enable signal;
   said multiplexer being coupled to receive as a control input said scan mode enable signal from said first OR gate;
   said first clock latch having a data input coupled to a data output of said multiplexer and a strobe input coupled to receive a first clock signal including an A clock signal; and
   said second latch, having a data input coupled to receive data output of said first clock latch and a strobe input coupled to receive a second clock signal including a B clock signal.

3. The scan control circuit according to claim 2 further including:
   a first OR gate coupled to receive a first system clock signal and said A clock signal and to provide alternately said first system clock signal and said A clock signal to said strobe input of said first latch; and
   a second OR gate coupled to receive a second system clock signal and said B clock signal and to provide said second system clock signal or said B clock signal to said strobe input of said first latch.

4. A circuit for controlling scan data in a level sensitive scan design, said circuit comprising:
   a delay line;
   a multiplexer;
   a first latch;
   a second latch;
   a first AND gate; and
   a second AND gate;
   said delay line having a first delay output and a second delay output, said delay line having an input for a scan clock whose duration is longer than the duration of propagation in said first delay output;
   said delay line having its second delay output coupled to a scan mode enable input control of said multiplexer;
   said first latch having a data input coupled to a data output of said first multiplexer and strobe input coupled to receive a first clock signal including an A clock signal;
   said second latch having a data input coupled to receive data output of said first latch and a strobe input coupled to receive a second clock signal including a B clock signal;
   said first AND gate having a first input coupled to said first delay output and a second input coupled to receive an inverted representation of said scan clock, for producing said A clock signal; and
   said second AND gate being coupled to receive as one input said scan clock and as a second input an inverted representation of said first delay output of said scan clock to produce said B clock.

5. The scan control circuit according to claim 4 further including:
   a first OR gate coupled to receive a first system clock signal and said A clock signal and to provide alternately said first system clock signal and said A clock signal to said strobe input of said first latch; and
   a second OR gate coupled to receive a second system clock signal and said B clock signal and to provide said second system clock signal or said B clock signal to said strobe input of said first latch.

* * * * *